(12) United States Patent
MacDonald et al.

(10) Patent No.: US 10,259,081 B2
(45) Date of Patent: Apr. 16, 2019

(54) CONNECTING METAL FOILS/WIRES AND COMPONENTS IN 3D PRINTED SUBSTRATES WITH WIRE BONDING

(71) Applicant: Board of Regents, The University of Texas System, Austin, TX (US)

(72) Inventors: Eric MacDonald, El Paso, TX (US); David Espalin, El Paso, TX (US); Ryan Wicker, El Paso, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 15/426,379

(22) Filed: Feb. 7, 2017

(65) Prior Publication Data

US 2017/0225273 A1    Aug. 10, 2017

Related U.S. Application Data

(60) Provisional application No. 62/292,414, filed on Feb. 8, 2016.

(51) Int. Cl.
*B33Y 10/00* (2015.01)
*B23K 20/00* (2006.01)
(Continued)

(52) U.S. Cl.
CPC ............ *B23K 31/02* (2013.01); *B23K 20/004* (2013.01); *B23K 20/10* (2013.01); *B29C 39/10* (2013.01); *B29C 64/106* (2017.08); *B29C 70/885* (2013.01); *B33Y 10/00* (2014.12); *B33Y 40/00* (2014.12); *B33Y 70/00* (2014.12);
(Continued)

(58) Field of Classification Search
None
See application file for complete search history.

(56) References Cited

U.S. PATENT DOCUMENTS 6,549,821 B1 * 4/2003 Farnworth ............ B29C 70/70
264/163
7,555,357 B2 * 6/2009 Holzwarth ............ B29C 64/106
700/118
(Continued)

OTHER PUBLICATIONS

Fan, S. L. et al., UV curing of a liquid based bismaleimide-containing polymer system, eXPRESS Polymer Letters (2007)1(6):397-405.

(Continued)

*Primary Examiner* — Devang R Patel
(74) *Attorney, Agent, or Firm* — Yee & Associates, P.C.

(57) ABSTRACT

A three-dimensional electronic, biological, chemical, thermal management, or electromechanical apparatus and method thereof. One or more layers of a three-dimensional structure are deposited on a substrate. The three-dimensional structure is configured to include one or more internal cavities using, an extrusion-based additive manufacturing system enhanced with a range of secondary embedding processes. The three-dimensional structure includes one or more structural integrated metal objects spanning the one or more of the internal cavities of the three-dimensional structure for enhanced electromagnetic properties and bonded between two or more other metal objects located at the same layer or different layers of the three-dimensional structure.

9 Claims, 9 Drawing Sheets

(51) Int. Cl.
*B29C 64/00* (2017.01)
*B23K 31/02* (2006.01)
*B23K 20/10* (2006.01)
*B33Y 40/00* (2015.01)
*B33Y 80/00* (2015.01)
*B33Y 70/00* (2015.01)
*H05K 1/02* (2006.01)
*H05K 3/46* (2006.01)
*H05K 3/34* (2006.01)
*B29C 70/88* (2006.01)
*B29C 39/10* (2006.01)
*H05K 3/40* (2006.01)
*B29C 64/106* (2017.01)
*B29K 705/00* (2006.01)
*B23K 101/36* (2006.01)

(52) U.S. Cl.
CPC ............ *B33Y 80/00* (2014.12); *H05K 1/0284* (2013.01); *H05K 3/34* (2013.01); *H05K 3/4046* (2013.01); *H05K 3/4644* (2013.01); *H05K 3/4664* (2013.01); *H05K 3/4697* (2013.01); *B23K 2101/36* (2018.08); *B29K 2705/00* (2013.01); *H01L 2224/48091* (2013.01); *H05K 2201/09036* (2013.01); *H05K 2201/10287* (2013.01); *H05K 2203/0285* (2013.01); *H05K 2203/049* (2013.01)

(56) References Cited

U.S. PATENT DOCUMENTS

| | | | |
|---|---|---|---|
| 7,766,641 | B2 | 8/2010 | Silverbrook |
| 7,942,987 | B2 * | 5/2011 | Crump .................. B22F 3/1055 148/516 |
| 8,215,371 | B2 * | 7/2012 | Batchelder .............. C22C 43/00 164/155.1 |
| 8,665,479 | B2 | 3/2014 | Tan et al. |
| 9,193,110 | B2 | 11/2015 | Pridoehl et al. |
| 9,216,546 | B2 | 12/2015 | DeSimone et al. |
| 2003/0003179 | A1 * | 1/2003 | Farnworth ......... B23K 26/0734 425/174.4 |
| 2007/0229927 | A1 | 10/2007 | Iriguchi |
| 2013/0170171 | A1 | 7/2013 | Wicker et al. |
| 2014/0265036 | A1 | 9/2014 | Eden et al. |
| 2014/0268604 | A1 | 9/2014 | Wicker et al. |
| 2014/0268607 | A1 | 9/2014 | Wicker et al. |
| 2015/0276941 | A1 | 10/2015 | Liu et al. |

OTHER PUBLICATIONS

Pandey, R., Photopolymers in 3D printing applications, Degree Thesis, Plastics Technology, 2014, 59 pages.

* cited by examiner

CONNECTING METAL FOILS/WIRES AND COMPONENTS IN 3D PRINTED SUBSTRATES WITH WIRE BONDING

CROSS-REFERENCE TO PROVISIONAL APPLICATION

This nonprovisional patent application claims the benefit under 35 U.S.C. § 119(e) and priority to U.S. Provisional Patent Application Ser. No. 62/292,414 filed on Feb. 8, 2016, entitled "Connecting Metal Foils/Wires and Components in 3D Printed Substrates with Wire Bonding," which is hereby incorporated herein by reference in its entirety.

TECHNICAL FIELD

Embodiments are related to the field of additive manufacturing, and more particularly to printing three-dimensional (3D) objects utilizing material extruders. Embodiments are also related to the manufacture of 3D printed components with structurally integrated metal objects that can serve as thermal or electrical interconnections.

BACKGROUND 3D printing is an AM (Additive Manufacturing) process for making three-dimensional objects of arbitrary shapes from digital models. Other terms used synonymously to refer to 3D printing include additive manufacturing, layer manufacturing, rapid prototyping, layer-wise fabrication, solid freeform fabrication, and direct digital manufacturing. In 3D printing, successive layers of a material are laid down adjacently to form the objects. Typically, a round or ribbon like material is extruded through a movable nozzle.

Examples of AM processes and 3D printers are disclosed in U.S. Patent Application Publication No. 2013/0170171, entitled "Extrusion-Based Additive Manufacturing System for 3D Structural Electronic, Electromagnetic and Electromechanical Components/Devices," which was published on Jul. 4, 2013 and is incorporated herein by reference in its entirety. Other examples of AM processes and 3D printers are disclosed in U.S. Patent Application Publication No. 2014/0268604, entitled "Methods and Systems For Embedding Filaments in 3D Structures, Structural Components, and Structural Electronic, Electromagnetic and Electromechanical Components/Devices," which was published on Sep. 18, 2014 and is incorporated herein by reference in its entirety. Still, other examples of AM processes and 3D printers are disclosed in U.S. Patent Application Publication No. 2014/0268607, entitled "Methods and Systems For Connecting Inter-Layer Conductors and Components in 3D Structures, Structural Components, and Structural Electronic, Electromagnetic and Electromechanical Components/Devices," which also published on Sep. 18, 2014 and is incorporated herein by reference in its entirety.

The next generation of manufacturing technology will require complete spatial control of material and functionality as structures are created layer-by-layer, thereby providing fully customizable, high value, multi-functional products for the consumer, biomedical, aerospace, and defense industries. With contemporary AM (also known more popularly as 3D printing) providing the base fabrication process, a comprehensive manufacturing suite will be integrated seamlessly to include: 1) additive manufacturing of a wide variety of robust plastics/metals; 2) micromachining; 3) laser ablation; 4) embedding of wires, metal surfaces, and fine-pitch meshes submerged within the dielectric substrates; 5) microdispensing; 6) wire bonding; and 7) robotic component placement.

Collectively, the integrated technologies will fabricate multi-material structures through the integration of multiple integrated manufacturing systems (multi-technology) to provide multi-functional products (e.g., consumer wearable electronics, bio-medical devices, defense, thermal management, space and energy systems, etc.).

Paramount to this concept is the connection (thermal or electrical) between conductive traces and surfaces at different levels of the 3D printed dielectric substrate as well as connecting the traces and surfaces to metallic pins of components at the same or different levels in the substrate. Wire bonding can provide this functionality, but leaves a arching wire that can be damaged or which may obstruct the print head of a 3D printer during subsequent fabrication operations.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings and abstract as a whole.

It is therefore, one aspect of the disclosed embodiments to provide for a 3D printed component with structural integrated metal objects capable of serving as thermal or electrical connections.

It another aspect of the disclosed embodiments to provide for connections between conductive traces and surfaces at different levels of 3D printed dielectric substrates as well as connecting the traces and surfaces of metallic pins of components at the same or different levels in the substrate.

It is another aspect of the disclosed embodiments to provide for a wire bonding configuration with an arching wire arrangement based on a levee around the arching wire.

It is a further aspect of the disclosed embodiments to provide for a levee around the arching wire which is later filled with liquid curable polymer or thermal set polymer or other curable liquid resin, the wire can be set permanently and protected during further fabrication.

The aforementioned aspects and other objectives and advantages can now be achieved as described herein. A three-dimensional electronic, biological, chemical, thermal management or electromechanical apparatus and method of making such an apparatus are disclosed. In an example embodiment, one or more layers of a three-dimensional structure are deposited on a substrate. The three-dimensional structure is configured to include one or more internal cavities using an extrusion-based additive manufacturing system enhanced with a range of secondary embedding processes. The three-dimensional structure includes one or more structural integrated metal objects spanning the one or more of the internal cavities of the three-dimensional structure for enhanced electromagnetic properties and bonded between two or more other metal objects located at the same layer or different layers of the three-dimensional structure.

In another example embodiment, a three-dimensional electronic or electromechanical apparatus can be configured by depositing one or more layers of a three-dimensional structure on a substrate. Such a three-dimensional structure can include one or more internal layers with structurally integrated conductive traces or surfaces or components with conductive pin by using an additive manufacturing system enhanced with a range of secondary embedding processes.

Wire bonding can be used to ultrasonically connect two isolated metal structures (e.g., wire, foil, pin of component) at the same or different fabrication level and then additional polymer can be printed to provide a cavity to act as a reservoir. The cavity completely subsumes the arching wire—the top of which is below the open surface of the cavity. The reservoir cavity is then filled with a liquid curable polymer or other liquid curable resin and subsequently cured. Once hardened, the new polymer or resin sets and protects the fragile wire bond wire and helps maintain the connection between the two metal structures and provides a planar surface from which the 3D printing can resume unobstructed.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1A:
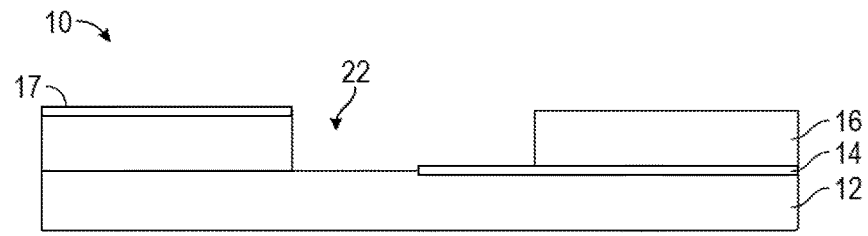
FIGS. 1A, 1B, 1C, and 1D illustrate flow diagrams depicting a method for forming a 3D printed apparatus in accordance with an example embodiment.
Figure 1B:
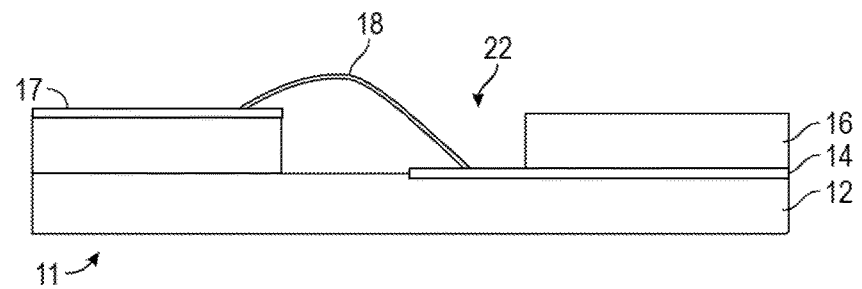
Figure 1C:
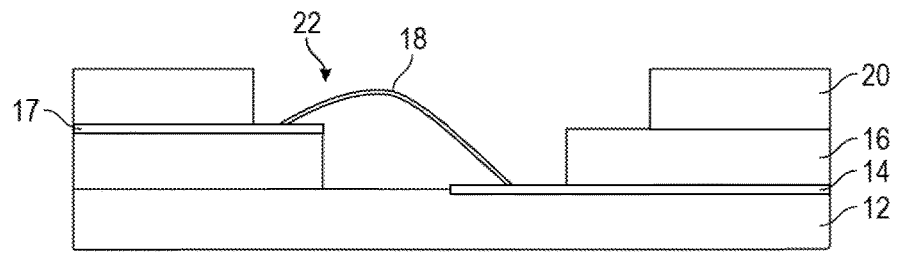
Figure 1D:
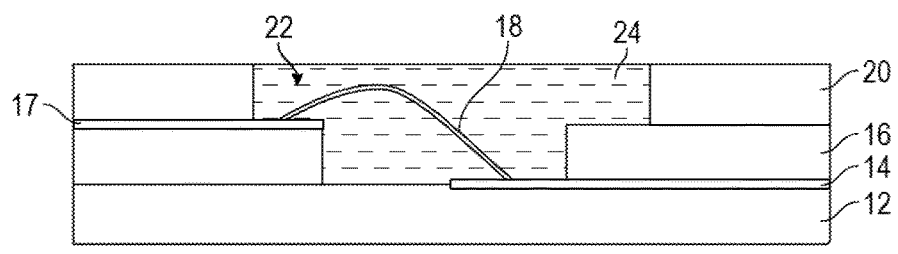

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can he embodied in many different forms and should not be construed as limited to the embodiments set forth herein; rather, these embodiments are provided so that this disclosure will be thorough and complete, and will fully convey the scope of the invention to those skilled in the art. Like numbers refer to identical, like or similar elements throughout, although such numbers may be referenced in the context of different embodiments. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments disclosed are related to the manufacture of three-dimensional printed components with structurally integrated metal objects serving as thermal or electrical interconnect. Wire embedding integrates wires into two layers of dielectric with a void (possibly circular and with one, two, or more layers of dielectric thickness). The top wire spans the void that will later be filled by dispensing of a conductive ink. This conductive ink via after curing serves as an interlayer conductor connection and connects both wires both mechanically and electrically. Optionally, a third dielectric layer can be printed before dispensing the conductive ink which provides only restricted access (choked via) that subsequently provides mechanical support and protection for the cured conductive ink via.

FIGS. 1A, 1B, 1C, and 1D illustrate flow diagrams depicting a method 10 for forming a 3D printed apparatus 11 in accordance with an example embodiment. The method 10 shown in FIGS. 1A, 1B, 1C, and 1D include four Steps A, B, C, and D. As shown at step A (FIG. 1A), a 3D printed apparatus 11 possesses a structure composed of a dielectric polymer layer 12, a metallic component 14 (e.g., copper wire or foil), and another polymer layer 16. A second metallic component 17 (e.g., wire, foil, etc.) is deposited above the layer 16. Thus, the structure of the apparatus 11 includes a 3D printed thermoplastic substrate with one or more metallic component(s) 14 integrated between the polymer layers 12 and 16, and a second metallic component located above the reservoir 22. A gap, cavity, or reservoir 22 can be formed above the dielectric layer 12 and from the layer 16. As will be shown in subsequent fabrication or processing Steps B, C, and D, the reservoir 22 will change in size (i.e., will grow with additional layers).

As depicted at step B (FIG. 1B), a wire bonded wire 18 between levels connects (e.g., thermal or electrical) the metallic component 14 (e.g., wire, foil, etc.) from different levels or from the metallic component 14 to components such as component 17 on the same or different levels with ultrasonic welds. In other words, wire 18 connects metallic component 17 with metallic component 14 through the gap 22.

As shown at Step C (FIG. 1C), additional layers of thermoplastic such as a thermoplastic layer 20 can be printed above layer 16 and the metallic component 17 to provide reservoir 22, the top of which is above the arching wire 18. In other words, the gap is now higher than in prior steps. As depicted thereafter at Step D (FIG. 1D), the reservoir 22 can be filled with a liquid curable polymer 24 and cured to set and protect the wire bond wire 18.

The fabrication process shown in FIGS. 1A, 1B, 1C, and 1D can be implemented utilizing an extrusion-based additive manufacturing system enhanced with a range of possible secondary embedding processes with two or more structurally integrated metal objects spanning across one or more levels of a 3D printed plastic substrate. The final formed apparatus 11 includes connections between metallic pins of components to other components or to conductive traces or surfaces at the same or different 3D printed layers.

Note that as utilized herein, the term "structurally integrated" as utilized herein can be defined as being connected to the structure in a such a way as to: (1) require a force to remove the metal object from the structure, and (2) provide an improvement in the properties of the plastic structure mechanically, thermally, and/or electrically. Additionally, metal structures as discussed herein can include wires with diameters ranging from sub-micron sizes upwards to almost any diameter, beams of rectangular, triangular, or any other arbitrary cross-sectional geometry, lattice structures, wire meshes, metal foils, and metal sheets.

FIGS. 1A, 1B, 1C and 1D illustrate a cross-section of four respective Steps A, B, C, D in a 3D printing flow in which thermoplastic is deposited, the metallic component 14 is integrated, a second layer 16 of polymer is deposited, and a second metallic component 17 is integrated. Then as shown at Step B, the wire 18 is wire-bonded between the two integrated metallic components 14 and 17 at two different (or the same) levels of the substrate. Further, plastic can be deposited to build the cavity or reservoir 22 of which the top surface is above the highest arching point of the wire-bond wire 18 as shown at Step C. The cavity 22 is used as a reservoir and is filled with the liquid curable polymer 24. Upon curing (e.g., UV, thermal, or otherwise), the curable polymer hardens and in doing so sets and protects the dangling and arching wire 18—which now becomes a stable and permanent connection between the two original integrated metallic components 14 and 17.

The three-dimensional electronic or electromechanical apparatus 11 can be configured by depositing one or more layers of a three-dimensional structure on a substrate. Such a three-dimensional structure can include one or more internal layers with structurally integrated conductive traces or surfaces or components with conductive pin by using an additive manufacturing system enhanced with a range of secondary embedding processes.

Wire bonding can be used to ultrasonically connect the two isolated metal structures or components 14 and 17 (e.g., wire, foil, pin of a component, etc.) at the same or different fabrication level and then additional polymer layers can be 3D printed to provide the cavity 22 to act as a reservoir. The cavity 22 completely subsumes the arching wire 18—the top of which is below the open surface of the cavity 22. The reservoir cavity 22 is then filled with a liquid curable polymer 24 and subsequently cured. Once hardened, the new polymer sets and protects the fragile wire bond wire 18, helps maintain the connection between the two metal structures/components 14, 17, and provides a planar surface from which 3D printing operations can resume unobstructed.

Figure 2:
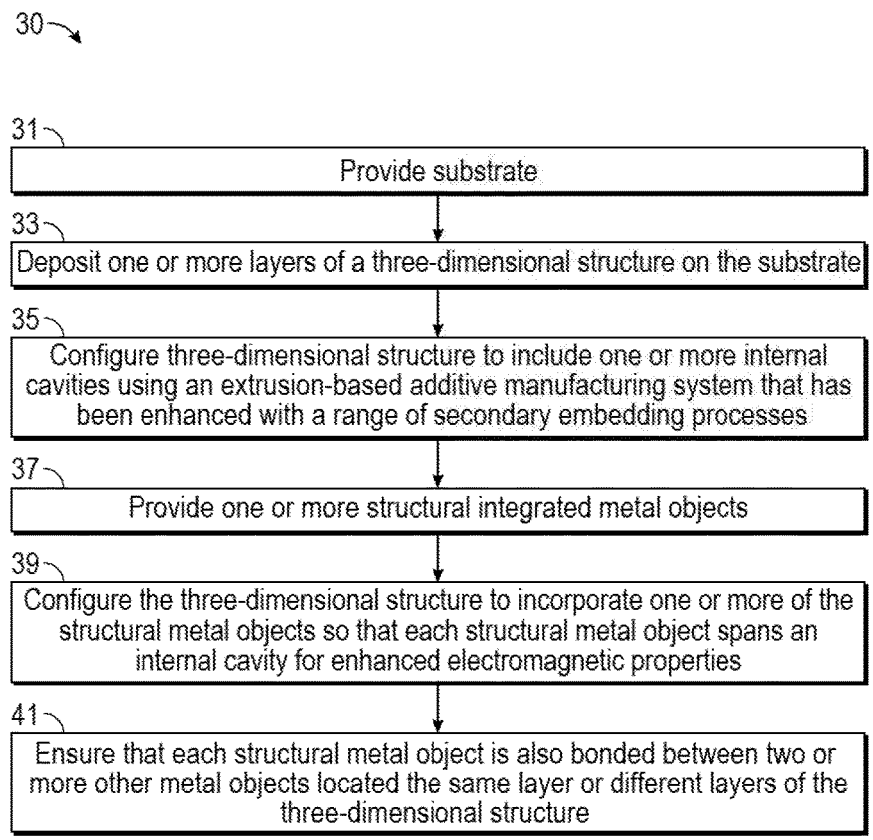
FIG. 2 illustrates a flow chart of operations depicting a method of forming or configuring a three-dimensional electronic, biological, chemical, thermal management, or electromechanical apparatus, in accordance with an example embodiment.

FIG. 2 illustrates a flow chart of operations depicting a method 30 of forming or configuring a three-dimensional electronic, biological, chemical, thermal management, or electromechanical apparatus, in accordance with an example embodiment. As indicated at block 31, a substrate is provided. Then, as shown at block 33, a step or operation can be implemented in which one or more layers of a three-dimensional structure are deposited on the substrate. Next, as illustrated at block 35, a step or operation can be implemented in which the three-dimensional structure is configured to include one or more internal cavities using an extrusion-based additive manufacturing system or device that has been enhanced with a range of secondary embedding processes. Note than an example of an extrusion-based additive manufacturing system or device that can be utilized in this regard is shown and discussed herein with respect to FIGS. 3A-3D.

As shown next at block 37, a step or operation can be implemented in which one or more structural metal objects are provided, followed by a step or operation, as depicted at block 39, in which the three-dimensional structure is configured to incorporate or include said each structural integrated metal object in a manner in which each structure integrated metal object spans each respective internal cavity (for enhanced electromagnetic properties). Finally, as depicted at block 41, a step or operation can be provided to ensure that each structural metal object is bonded between at least two other metal objects located at the same layer or different layers of said three-dimensional structure.

Referring now to FIGS. 3A-3D, an example of an extrusion-based additive manufacturing system 100 for three-dimensional structural electronic, electromagnetic, or electromechanical components/devices is shown, in accordance with an example embodiment. The extrusion-based additive manufacturing system 100 is preferably enhanced with a range of secondary embedding process. That is, the extrusion-based additive manufacturing system 100 can be configured to implement various types of secondary embedding processes.

Figure 3A:
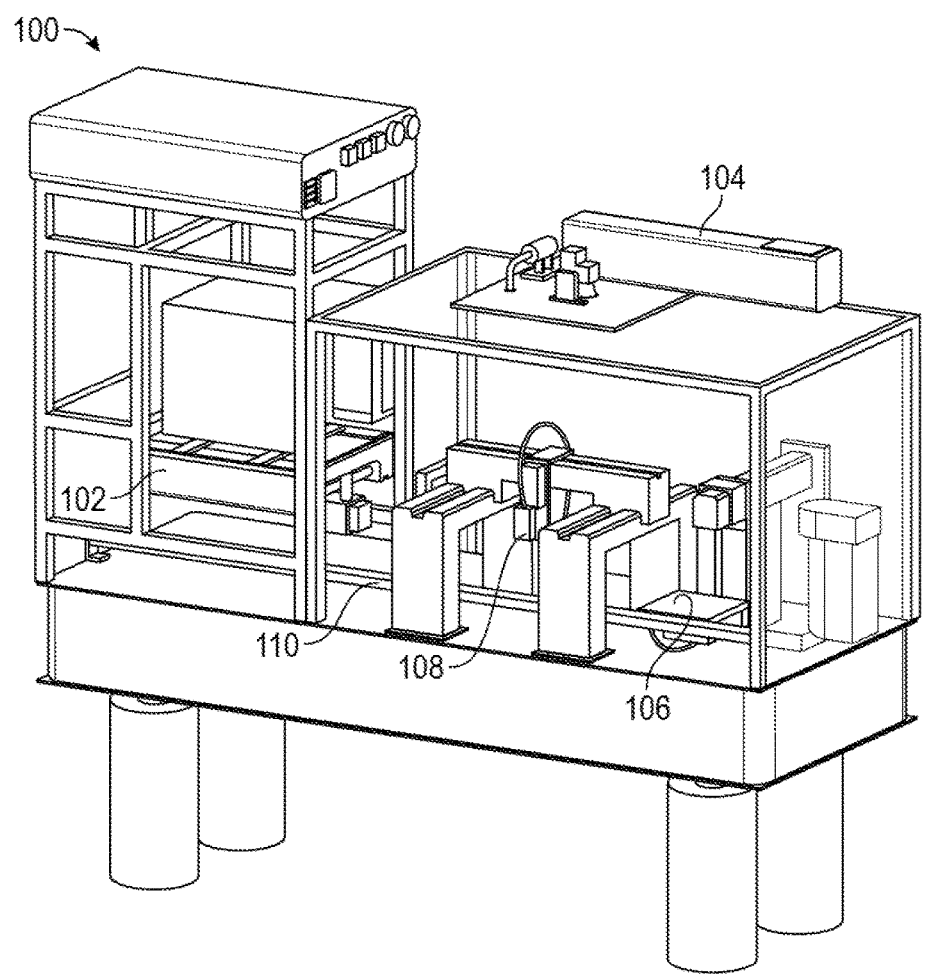
FIGS. 3A-3D illustrate an example of an extrusion-based additive manufacturing system for three-dimensional structural electronic, electromagnetic, and electromechanical components/devices, which can be utilized in accordance with an example embodiment.
Figure 3B:
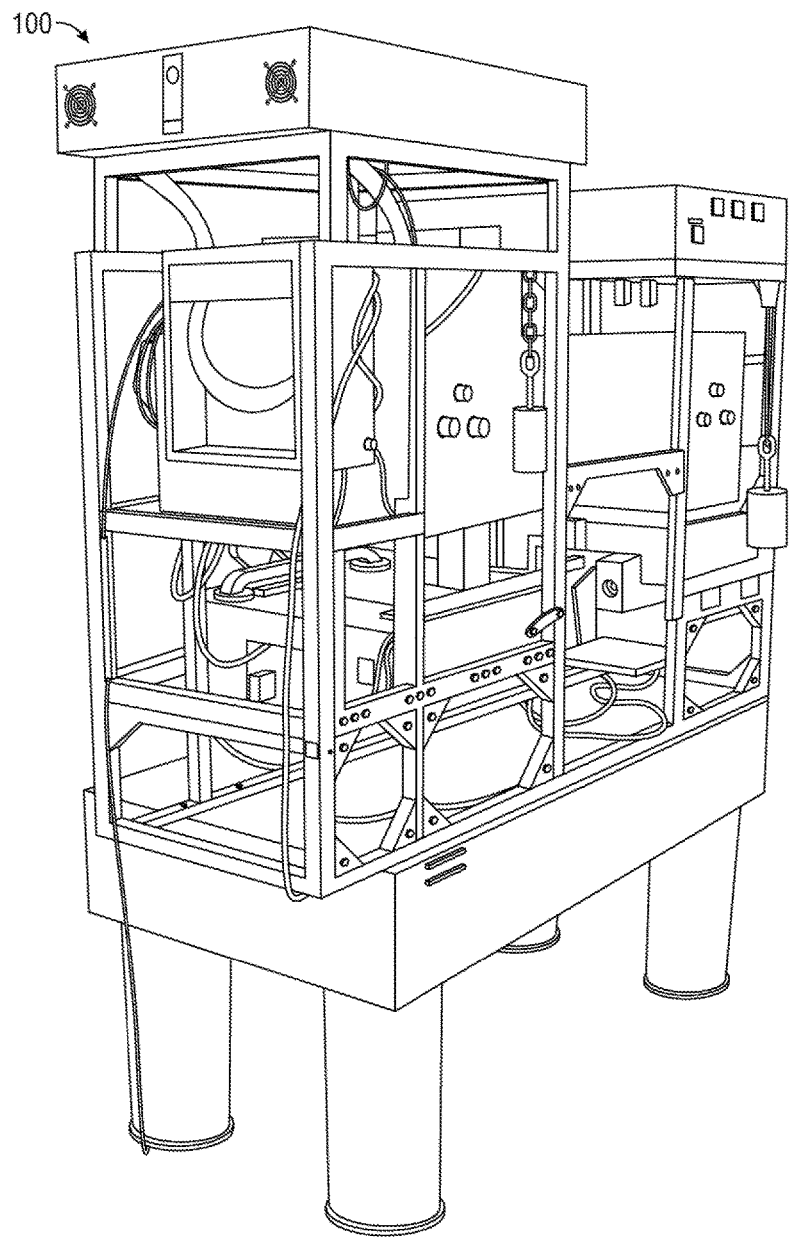
Figure 3C:
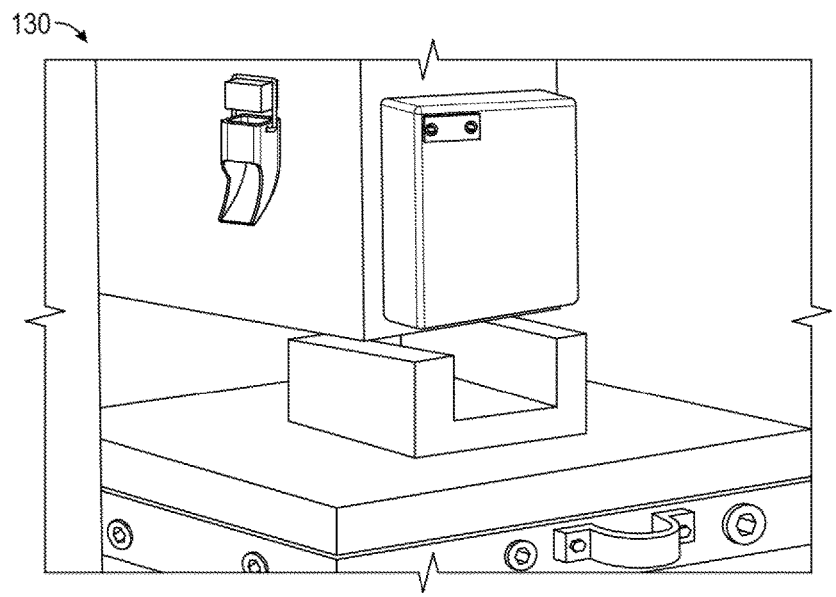
Figure 3D:
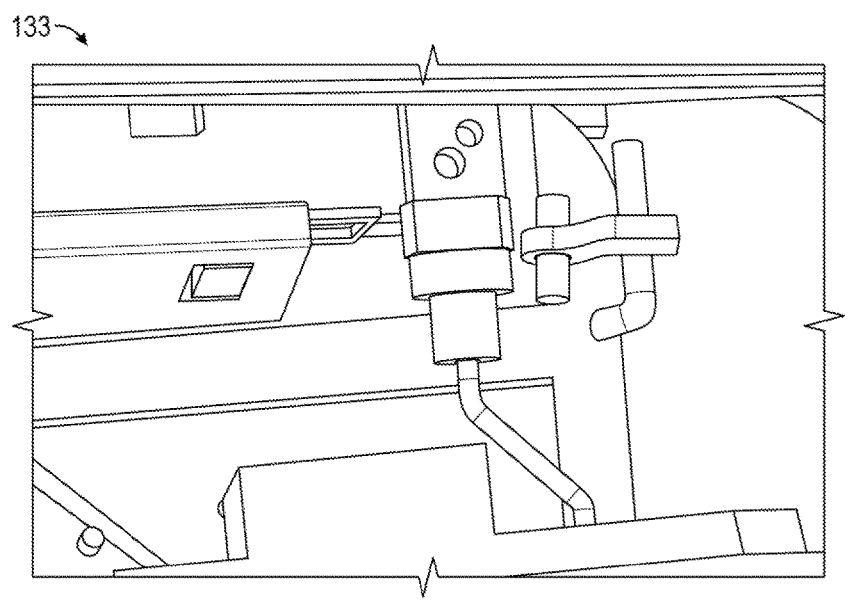

The example embodiment depicted in FIGS. 3A-3B illustrate a partially completed system 100, FIG. 3C, for example, shows an example FDM tooling head 130, and FIG. 3D shows a DW microdispensing head 133. As depicted in FIG. 3A, in some example embodiments, the system 100 for making a three-dimensional electronic, electromagnetic, or electromechanical component/device can include a fused deposition modeling machine 102 that creates one or more layers of a three-dimensional substrate by depositing a substrate material in a layer-by-layer fashion, a micro-machining machine, or a laser ablation machine 104 that removes a portion of the substrate to form a plurality of interconnection cavities and electronic component cavities within the substrate, a direct-write or direct-print microdispensing machine 106 that fills the interconnection cavities with a conductive material, and a pick and place machine 108 that places one or more electronic components in the electronic component cavities. The laser 104 can also cure the conductive material. The system 100 can also include in some example embodiments a pneumatic slide 110 that transports the three-dimensional substrate to each machine or sub-system. All of the machines can be integrated into a single machine or similar manufacturing system or process.

Figure 4:
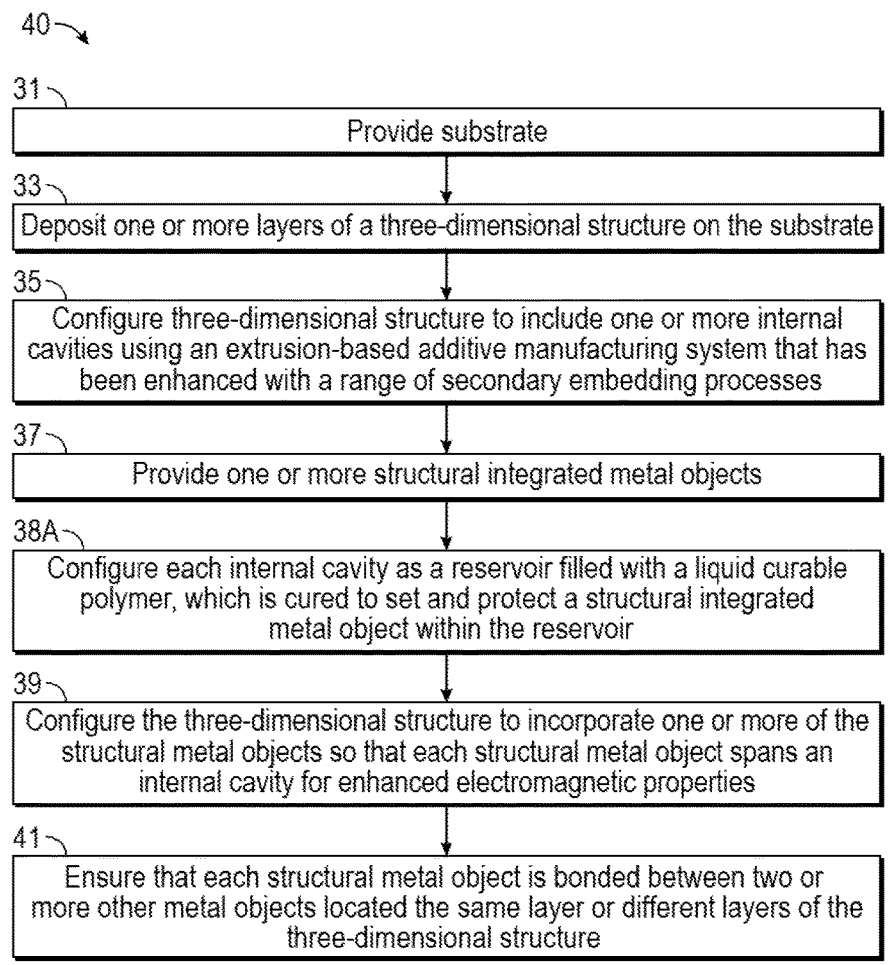
FIG. 4 illustrates a flow chart of operations depicting a method of forming or configuring a three-dimensional electronic, biological, chemical, thermal management, or electromechanical apparatus that includes one or more internal cavities each filled with a liquid curable polymer, in accordance with an example embodiment.

FIG. 4 illustrates a flow chart of operations depicting a method 40 of forming or configuring a three-dimensional electronic, biological, chemical, thermal management, or electromechanical apparatus that includes one or more internal cavities each filled with a liquid curable polymer, in accordance with an example embodiment. Note that in FIGS. 2, 4, 5, 6, and 7 herein, similar elements or blocks are indicated by similar or identical reference numerals. Thus, in FIG. 4, a step or operation is shown at block 38A in which each internal cavity is configured as a reservoir that is filled with a liquid curable polymer, which is cured to set and protect one or more structural metal objects within the reservoir. Thus, method 40 shown in FIG. 4 is similar to method 30 depicted in FIG. 2 with the addition of the operation depicted at block 38A.

Figure 5:
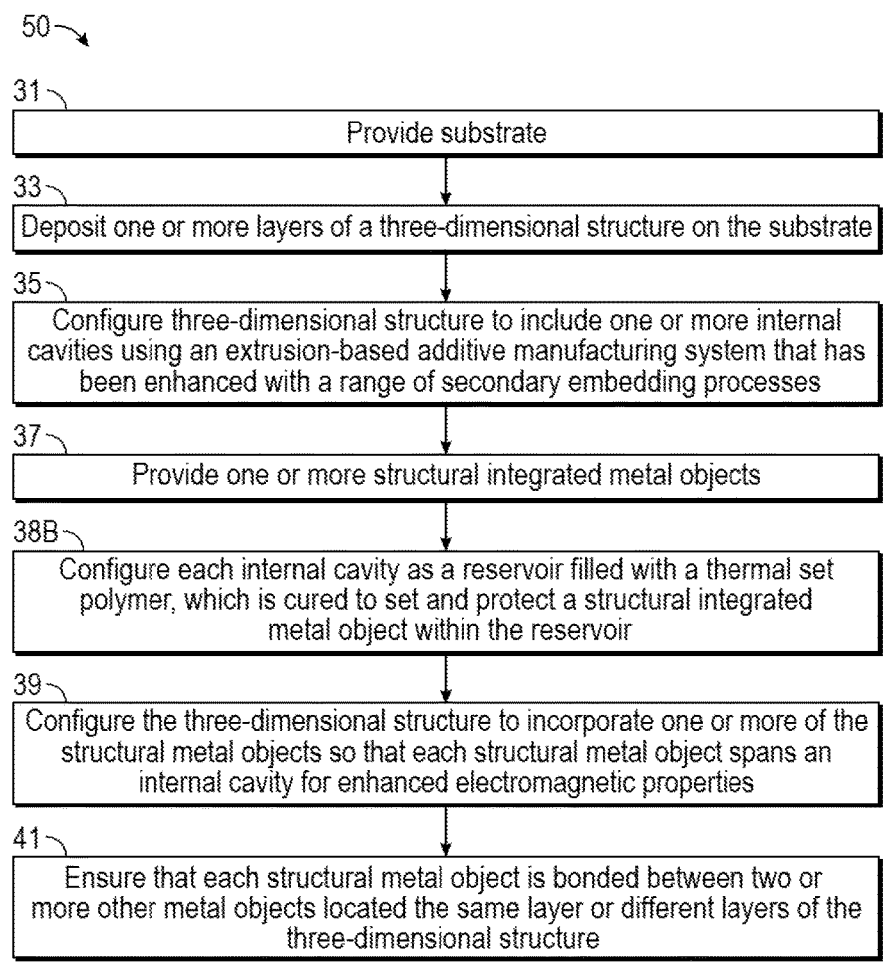
FIG. 5 illustrates a flow chart of operations depicting a method of forming or configuring a three-dimensional electronic, biological, chemical, thermal management, or electromechanical apparatus that includes one or more internal cavities each filled with a thermal set polymer, in accordance with an example embodiment.

FIG. 5 illustrates a flow chart of operations depicting a method 50 of forming or configuring a three-dimensional electronic, biological, chemical, thermal management, or electromechanical apparatus that includes one or more internal cavities each filled with a thermal set polymer, in accordance with an example embodiment. In FIG. 5, a step or operation is shown at block 38B in which each internal cavity is configured as a reservoir that is filled with thermal set polymer, which can also be cured to set and protect one or more structural metal objects within the reservoir. Thus, method 50 shown in FIG. 5 is similar to method 30 depicted in FIG. 2 with the addition of the operation depicted at block 38B.

Figure 6:
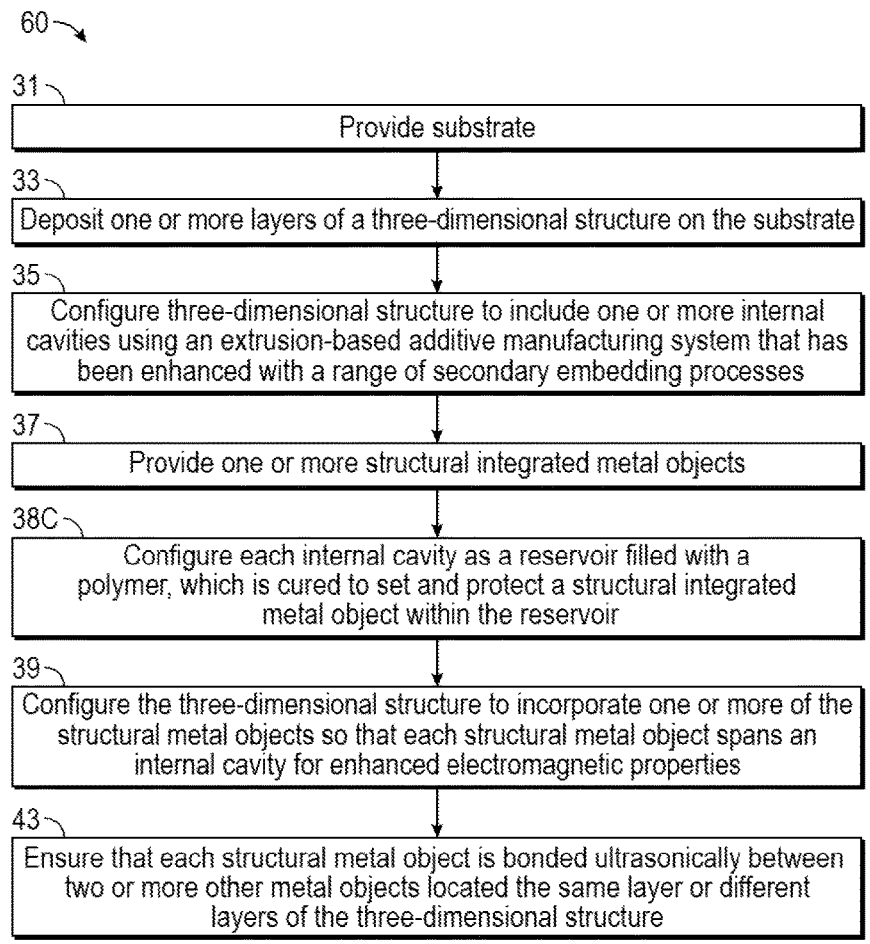
FIG. 6 illustrates a flow chart of operations depicting a method of forming or configuring a three-dimensional electronic, biological, chemical, thermal management, or electromechanical apparatus having ultrasonically structural metal objects, in accordance with an example embodiment.

FIG. 6 illustrates a flow chart of operations depicting a method 60 of forming or configuring a three-dimensional electronic, biological, chemical, thermal management, or electromechanical apparatus having ultrasonically structural metal objects, in accordance with an example embodiment. The step or operation depicted at block 43 in FIG. 6 is similar to the step or operation shown in FIG. 2 at block 41 with the difference that each structural metal object is ultrasonically bonded between the two or more other metal objects. Also, instead of the operation shown at block 38B in FIG. 5, the operation shown at block 38C involves filling each reservoir generally with a polymer.

Figure 7:
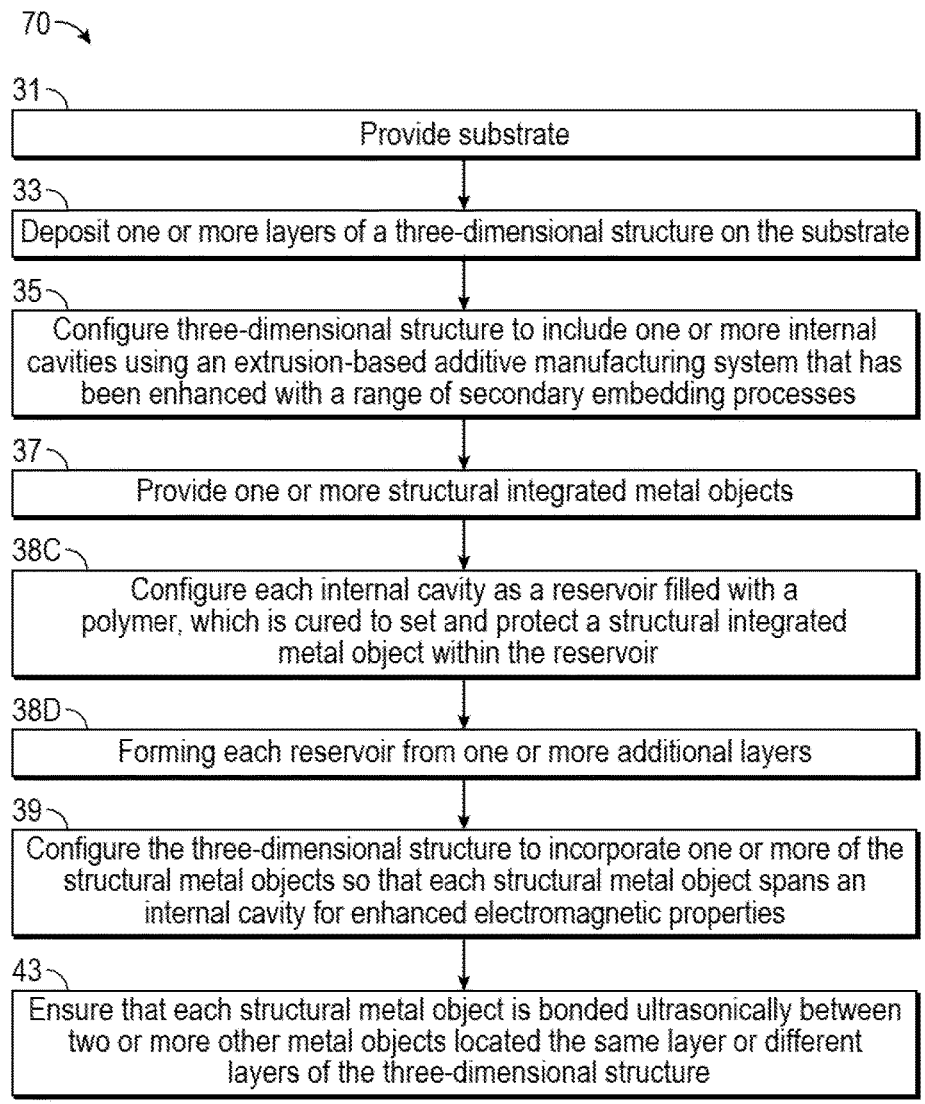
FIG. 7 illustrates a flow chart of operations depicting a method of forming or configuring a three-dimensional electronic, biological, chemical, thermal management, or electromechanical apparatus having reservoirs formed from additional layers, in accordance with an example embodiment.

FIG. 7 illustrates a flow chart of operations depicting a method 70 of forming or configuring a three-dimensional electronic, biological, chemical, thermal management, or electromechanical apparatus having reservoirs formed from additional layers, in accordance with an example embodiment. The method 70 shown in FIG. 7 is similar to the method 60 depicted in FIG. 6 with the addition of a specific step or operation for forming each additional reservoir from the one or more additional layers as shown at block 38D. That is, the operation shown at block 38D in FIG. 7 involves forming each reservoir from at least one additional layer located above each layer (i.e., the "one or more" layers discussed with respect to block 33) of said three-dimensional structure.

It can be appreciated parts produced by one or more of the disclosed embodiments can be used in various applications such as, for example: 1) unmanned aerial systems (UASs) and unmanned aerial vehicles (UAVs) by providing aerodynamic parts with embedded sensors, communications, and electronics within structural components or by directly fabricating onto UAS and UAV surfaces; 2) customized mission-specific disposable electronics; 3) truly 3D antennas and photonic devices that improve communications; 4) replacement components for virtually any electronic system on a naval vessel; 5) custom fit sailor-borne electronics and communications systems; 6) disposable floating depth-specific sensor systems; 7) biomedical devices; and 8) metamaterial structures.

Based on the foregoing, it can be appreciated that a number of varying embodiments are disclosed herein. For example, in one embodiment, a three-dimensional electronic, biological, chemical, thermal management, or electromechanical apparatus (or system) can be implemented, which includes a substrate, at least one layer of a three-dimensional structure configured on the substrate. The three-dimensional structure includes at least one internal cavity configured by an extrusion-based additive manufacturing system enhanced with a range of secondary embedding processes, the three-dimensional structure further configured with at least one structural integrated metal object spanning the at least one internal cavity of the three-dimensional structure for enhanced electromagnetic properties.

In some example embodiments, the aforementioned substrate can be configured as a 3D printed thermoplastic substrate. In another example embodiment, the at least one layer of the three dimensional structure can be a dielectric polymer. In yet another example embodiment, the at least one structural integrated metal object can be a conductive wire. In still another example embodiment, the at least one structural integrated metal object can be a conductive foil. In another example embodiment, the at least one structural integrated metal object can be configured from conductive ink.

In another example embodiment, a method of making a three-dimensional electronic, biological, chemical, thermal management, or electromechanical component/device can be implemented. Such a method can include steps or operations such as, for example: creating at least one layer of a three-dimensional structure by depositing a substrate; and configuring the three-dimensional structure to include at least one internal cavity using an extrusion-based additive manufacturing system enhanced with a range of secondary embedding processes and further configuring the three-dimensional structure with structural integrated metal objects spanning the at least one internal cavity of the three-dimensional structure for enhanced electromagnetic properties.

It may be understood that particular embodiments described herein are shown by way of illustration and not as limitations of such embodiments, The principal features of the disclosed embodiments can be employed in various embodiments without departing from the scope of such embodiments. Those skilled in the art will recognize, or be able to ascertain using no more than routine experimentation, numerous equivalents to the specific procedures described herein. Such equivalents are considered to be within the scope of the disclosed embodiments and are covered by the claims.

All publications, patents, and patent applications mentioned in the specification are indicative of the level of skill of those skilled in the art to which this invention pertains. All publications, patents, and patent applications are herein incorporated by reference to the same extent as if each individual publication, patent, or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include"), or "containing" (and any form of containing, such as "contains" and "contain") are inclusive or open-ended and do not exclude additional, unrecited elements, or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as AA, AAA, BB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods the disclosed embodiments have been described in terms of preferred embodiments, it may be apparent to those skilled in the art that variations may be applied to the compositions and/or methods and in the steps or in the sequence of steps of the method described herein without departing from the concept, spirit, and scope of the disclosed embodiments. All such similar substitutes and modifications apparent to those skilled in the art are deemed to be within the spirit, scope, and concept of the disclosed embodiments as defined by the appended claims.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A method of forming a three-dimensional electronic apparatus, biological, chemical, thermal management, or electromechanical apparatus, said method comprising:
    forming a first polymer layer of a three-dimensional structure using extrusion based additive manufacturing;
    depositing a first metallic component on top of the first polymer layer, wherein the first metallic component extends from a first end of the first polymer layer over a portion of the first polymer layer that is less than the full length of the first polymer layer;
    forming a second polymer layer over the first polymer layer and first metallic component using extrusion based additive manufacturing, wherein the second polymer layer comprises a first internal gap that leaves a portion of the first polymer layer and first metallic component uncovered;
    depositing a second metallic component on top of the second polymer layer, wherein the second metallic component is on a side of the first internal gap opposite the first metallic component;
    providing at least one structural integrated metal object spanning a portion of said first internal gap for enhanced electromagnetic properties and bonded between the first metallic component and the second metallic component located at different layers of said three-dimensional structure;
    forming a third polymer layer over the second polymer layer and second metallic components using extrusion based additive manufacturing, wherein the third polymer layer comprises a second internal gap that is wider than the first internal gap and forms with the first internal gap a reservoir in which the structural integrated metal object and portions of the first and second metallic components to which the structural integrated metal object is bonded are uncovered;
    filling the reservoir with a liquid curable polymer such that the structural integrated metal object is completely encased within the liquid curable polymer; and
    curing said liquid curable polymer to set and protect the structural integrated metal object within the reservoir such that a bond between first metallic component and second metallic component becomes stable and permanent.

2. The method of claim 1 wherein said at least one structural integrated metal object comprises a wire.

3. The method of claim 1, wherein the first metallic component and the second metallic component comprise a wire or a foil.

4. The method of claim 1 wherein said at least one structural integrated metal object is bonded ultrasonically to the first metallic component and the second metallic component.

5. The method of claim 2 wherein said wire comprises an arching wire.

6. The method of claim 5 further comprising:
    configuring the second internal cavity to completely subsume said arching wire.

7. The method of claim 1 wherein at least one of the first polymer layer, second polymer layer, and third polymer layer comprise a dielectric polymer.

8. The method of claim 1 wherein the liquid curable polymer is thermally cured.

9. The method of claim 1 wherein the liquid curable polymer is UV cured.

* * * * *